(12) United States Patent
Cheong et al.

(10) Patent No.: US 9,166,096 B2
(45) Date of Patent: Oct. 20, 2015

(54) METHOD FOR MANUFACTURING SOLAR CELL AND DOPANT LAYER THEREOF

(71) Applicant: LG ELECTRONICS INC., Seoul (KR)

(72) Inventors: Juhwa Cheong, Seoul (KR); Yongduk Jin, Seoul (KR); Youngsung Yang, Seoul (KR); Manhyo Ha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 29 days.

(21) Appl. No.: 13/840,618

(22) Filed: Mar. 15, 2013

(65) Prior Publication Data

US 2013/0344647 A1 Dec. 26, 2013

(30) Foreign Application Priority Data

Jun. 22, 2012 (KR) .......................... 10-2012-0067537

(51) Int. Cl.
*H01L 31/18* (2006.01)
*H01L 31/0216* (2014.01)
*H01L 31/0224* (2006.01)

(52) U.S. Cl.
CPC ...... *H01L 31/1864* (2013.01); *H01L 31/02168* (2013.01); *H01L 31/022441* (2013.01); *H01L 31/18* (2013.01); *H01L 31/1804* (2013.01); Y02E 10/547 (2013.01)

(58) Field of Classification Search
CPC ............ H01L 21/324; H01L 21/26513; H01L 21/31662; H01L 21/02255; Y02E 10/547
USPC ............................................ 438/57, 530, 550
See application file for complete search history.

(56) References Cited

U.S. PATENT DOCUMENTS

| | | | |
|---|---|---|---|
| 4,676,845 A | 6/1987 | Spitzer | |
| 4,746,377 A | 5/1988 | Kobayashi et al. | |
| 6,444,551 B1* | 9/2002 | Ku et al. | 438/530 |
| 2005/0118802 A1* | 6/2005 | Tsao et al. | 438/663 |
| 2008/0078987 A1* | 4/2008 | Leusink | 257/19 |
| 2009/0068783 A1* | 3/2009 | Borden | 438/57 |
| 2012/0181667 A1* | 7/2012 | Geerligs et al. | 257/618 |
| 2012/0199202 A1* | 8/2012 | Prajapati | 136/261 |
| 2013/0109162 A1* | 5/2013 | Rogers et al. | 438/513 |

FOREIGN PATENT DOCUMENTS

| | | |
|---|---|---|
| CN | 1328348 A | 12/2001 |
| CN | 101447529 A | 6/2009 |
| CN | 101764173 A | 6/2010 |
| EP | 2 490 268 A1 | 8/2012 |
| TW | 579547 B | 3/2004 |

OTHER PUBLICATIONS

Forneris et al., "Oxide Capping for Thermal Drive-In", I.B.M. Tech. Disci. Bull., vol. 19, No. 5, Oct. 1976, p. 1703. Accessed via IP.com on Nov. 18, 2014. See attached.*

* cited by examiner

*Primary Examiner* — Su C Kim
*Assistant Examiner* — Regan J Rundio
(74) *Attorney, Agent, or Firm* — Birch, Stewart, Kolasch & Birch, LLP

(57) ABSTRACT

A method for manufacturing a dopant layer of a solar cell according to an embodiment of the invention includes: ion-implanting a dopant to a substrate; and heat-treating for an activation of the dopant. In the heat-treating for the activation, the substrate is heat-treated at a first temperature after an anti-out-diffusion film is formed at a temperature lower than the first temperature under a first gas atmosphere.

18 Claims, 15 Drawing Sheets

ST10

ST22

ST24

METHOD FOR MANUFACTURING SOLAR CELL AND DOPANT LAYER THEREOF

CROSS-REFERENCE TO RELATED APPLICATION

This application claims priority to and the benefit of Korean Patent Application No. 10-2012-0067537, filed on Jun. 22, 2012 in the Korean Intellectual Property Office, the disclosure of which is incorporated herein by reference.

BACKGROUND OF THE INVENTION

1. Field of the Invention

Embodiments of the invention relate to a method for manufacturing a solar cell and a dopant layer thereof. More particularly, the invention relates to a method for manufacturing a dopant layer having enhanced properties and to a method for manufacturing a solar cell including the same.

2. Description of the Related Art

Recently, as existing energy resources such as oil or coal are expected to be exhausted, an interest in alternative energy resources for replacing oil or coal is increasing. In particular, a solar cell that directly converts or transforms solar energy into electricity using a semiconductor element is gaining attention as a next-generation energy device.

In a solar cell, a p-n junction is formed by forming a dopant layer of an n-type or a p-type at a semiconductor substrate in order to induce photoelectric conversion, and an electrode electrically connected to the dopant layer is formed. In order to form the dopant layer having enhanced properties, dopants should be sufficiently doped to the semiconductor substrate during a process for forming the dopant layer. However, since "out-diffusion" in which the dopants are diffused to an outside of the semiconductor substrate is generated, a concentration of the dopant in the dopant layer may decrease and the dopant layer may not have desired properties. If an additional treatment for preventing the out-diffusion is performed, a manufacturing cost may increase greatly.

SUMMARY OF THE INVENTION

The embodiments of the invention are directed to providing a method for manufacturing a dopant layer having enhanced properties with a high productivity and to providing a method for manufacturing a solar cell including the same.

A method for manufacturing a dopant layer of a solar cell according to an embodiment of the invention includes steps of: ion-implanting a dopant to a substrate; and heat-treating for an activation of the dopant. In the heat-treating for the activation, the substrate is heat-treated at a first temperature after an anti-out-diffusion film is formed at a temperature lower than the first temperature under a first gas atmosphere.

A method for manufacturing a solar cell according to an embodiment of the invention includes: performing the above method to form the dopant layer on the substrate; and forming an electrode electrically connected to the dopant layer.

DETAILED DESCRIPTION OF THE EMBODIMENTS

Figure 1:
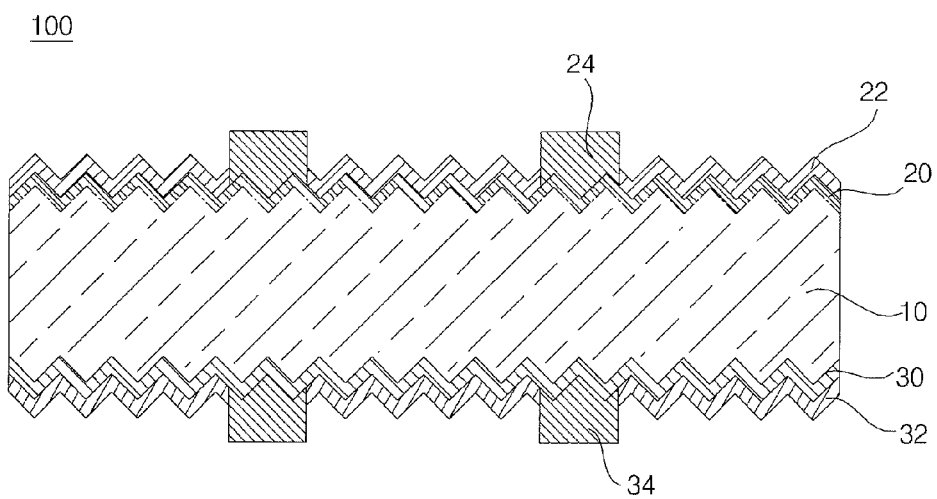
FIG. 1 is a cross-sectional view of a solar cell according to an embodiment of the invention.

Hereinafter, embodiments of the invention will be described with reference to the accompanying drawings. However, the embodiments of the invention are not limited to these embodiments, and various modifications of the embodiments are possible.

In order to clearly and concisely illustrate the embodiments of the invention, elements not related to the embodiments of the invention are omitted in the figures. Also, elements similar to or the same as each other have the same reference numerals in the figures whenever possible or practical. In addition, dimensions of layers and regions are exaggerated or schematically illustrated, or some layers are omitted for clarity of illustration. In addition, the dimension of each part as drawn may not reflect an actual size.

In the following description, when a layer or substrate "includes" another layer or portion, it can be understood that the layer or substrate can further include still another layer or portion. Also, when a layer or film is referred to as being "on" another layer or substrate, it can be understood that the layer of film is directly on the other layer or substrate, or intervening layers may also be present. Further, when a layer or film is referred to as being "directly on" another layer or substrate, it can be understood that the layer or film is directly on the another layer or substrate, and thus, there is no intervening layer.

Hereinafter, a method manufacturing a dopant layer of a solar cell and a method for manufacturing a solar cell according to embodiments of the invention will be described with reference to the accompanying drawings. First, a solar cell manufactured by a method for manufacturing a solar cell according to embodiments of the invention will be described. Then, a method of manufacturing a dopant layer of a solar cell and a method for manufacturing a solar cell according to embodiments of the invention will be described.

FIG. 1 is a cross-sectional view of a solar cell according to an embodiment of the invention.

Referring to FIG. 1, a solar cell 100 according to an embodiment includes a substrate 10 (for example, a semiconductor substrate 10), dopant layers 20 and 30 formed at the semiconductor substrate 10, and electrodes 24 and 34 electrically connected to the semiconductor substrate 10 or the dopant layers 20 and 30. More specifically, the dopant layers 20 and 30 may include a first dopant layer (hereinafter, referred to as "an emitter layer") 20 formed at or adjacent to a first surface (hereinafter, referred to as "a front surface") of the semiconductor substrate 10, and a second dopant layer (hereinafter, referred to as "a back surface field layer") 30 formed at or adjacent to a second surface (hereinafter, referred to as "a back surface") of the semiconductor substrate 10. Also, the electrodes 24 and 34 may include a first electrode (or a plurality of first electrodes) 24 electrically connected to the emitter layer 20, and a second electrode (or a plurality of second electrodes) 34 electrically connected to the semiconductor substrate 10 or the back surface field layer 30. In addition, the solar cell 100 may further include an anti-reflection layer 22 and a passivation layer 32. This will be described in more detail.

The semiconductor substrate 10 may include one or more of various semiconductor materials. For example, the semiconductor substrate 10 may include silicon having a dopant of a second conductivity type. Single crystal silicon or polycrystalline silicon may be used for the silicon, and the second conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, thereby forming a p-n junction therebetween. When light, such as sun light, is incident to the p-n junction, electron-hole pairs are generated, and the electrons generated by the photoelectric effect moves to the back surface of the semiconductor substrate 10 and are collected by the second electrode 34, and the holes generated by the photoelectric effect moves to the front surface of the semiconductor substrate 10 and are collected by the first electrode 24. Then, electric energy is generated thereby.

In this instance, the holes having mobility lower than that of the electrodes move to the front surface of the semiconductor substrate 10, not the back surface of the semiconductor substrate 10. Therefore, the conversion efficiency of the solar cell 100 can be enhanced.

The front and/or back surface of the semiconductor substrate 10 may be a textured surface to have protruded and/or depressed portions of various shapes (such as a pyramid shape) or be an uneven surface. Thus, surface roughness is increased by the protruded and/or depressed portions, and reflectance of the incident sun light at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 100. However, the embodiments of the invention are not limited thereto, and thus, the protruded and/or depressed portions may be formed at only one surface (especially, the front surface), or there may be no protruded and/or depressed portions at the front and back surfaces.

The emitter layer 20 including a first conductive type dopant may be formed at the front surface of the semiconductor substrate 10. A p-type dopant such as a group III element (for example, boron (B), aluminum (Al), gallium (Ga), indium (In) or the like) may be used for the first conductive type dopant.

The anti-reflection layer 22 and the first electrode 24 may be formed on the emitter 20 at the front surface of the semiconductor substrate 10.

The anti-reflection layer 22 may be formed substantially at the entire front surface of the semiconductor substrate 10, except for the portion where the first electrode 24 is formed. The anti-reflection layer 22 reduces reflectance (or reflectivity) of sun light incident to the front surface of the semiconductor substrate 10. Also, the anti-reflection layer 22 passivates defects at a surface or a bulk of the emitter layer 20.

By reducing the reflectance of sun light incident to the front surface of the semiconductor substrate 10, an amount of the sun light reaching the p-n junction formed between the semiconductor substrate 10 and the emitter layer 20 can be increased, thereby increasing a short circuit current (Isc) of the solar cell 100. By passivating the defects at the emitter layer 20, recombination sites of minority carrier are reduced or eliminated, thereby increasing an open-circuit voltage (Voc) of the solar cell 100. Accordingly, the open-circuit voltage and the short-circuit current of the solar cell 100 can be increased by the anti-reflection layer 22, and thus, the efficiency of the solar cell 100 can be enhanced.

The anti-reflection layer 22 may include one or more of various materials. For example, the anti-reflection layer 22 may have a single film structure or a multi-layer film structure including, for example, at least one material selected from a group consisting of silicon nitride, silicon nitride including hydrogen, silicon oxide, silicon oxy nitride, aluminum oxide, $MgF_2$, ZnS, $TiO_2$ and $CeO_2$. However, the embodiments of the invention are not limited thereto, and thus, the anti-reflection layer 22 may include one or more of various materials.

The first electrode 24 is electrically connected to the emitter layer 20 by penetrating the anti-reflection layer 22 at the front surface of the semiconductor substrate 10. The first electrode 24 may include one or more of various metals having high electrical conductivity. For example, the first electrode 24 may include silver (Ag) having high electrical conductivity. However, the embodiments of the invention are not limited thereto.

Also, the back surface field layer 30 including the second conductive type dopant with a concentration higher than that of the semiconductor substrate 10 is formed at the back surface of the semiconductor substrate 10. The back surface field layer 30 prevents or reduces the recombination of the electrons and holes at the back surface, and thus, enhances the efficiency of the solar cell 100. An n-type dopant such as a group V element (such as phosphorus (P), arsenic (As), bismuth (Bi), antimony (Sb), or the like) may be used as the second conductive type dopant.

The passivation layer 32 and the second electrode 34 may be formed at the back surface of the semiconductor substrate 10.

The passivation layer 32 may be formed substantially at the entire back surface of the semiconductor substrate 10, except for the portions where the second electrode 34 is formed. The passivation layer 32 passivates defects at the back surface of the semiconductor substrate 10, and eliminates the recombination sites of minority carrier. Thus, an open circuit voltage of the solar cell 100 can be increased.

The passivation layer 32 may include a transparent insulating material for passing the light. Thus, the light can be incident to the back surface of the semiconductor substrate 10 through the passivation layer 32, thereby enhancing the efficiency of the solar cell 100. The passivation layer 32 may have a single film structure or a multi-layer film structure including, for example, at least one material selected from a group consisting of silicon nitride, silicon nitride including hydrogen, silicon oxide, silicon oxy nitride, aluminum oxide, $MgF_2$, ZnS, $TiO_2$ and $CeO_2$. However, the embodiments of the invention are not limited thereto, and thus, the passivation film 32 may include one or more of various materials.

The second electrode 34 may include a metal having a high electric conductivity. For example, the second electrode 34 may include silver (Ag) having high electrical conductivity and high reflectance. When the silver having high reflectance is used, the light reaching the back surface of the semiconductor substrate 10 can be reflected by the silver and can proceed to an inside of the semiconductor substrate 10, thereby increasing an amount of the light used or available for the solar cell 100.

The second electrode 34 may have a width larger than that of the first electrode 24.

In the above embodiment of the invention, the semiconductor substrate 10 and the back surface field layer 30 are the n-types, and the emitter layer 20 is the p-type. However, the embodiments of the invention are not limited thereto. The semiconductor substrate 10 and the back surface field layer 30 may be the p-types, and the emitter layer 20 may be the n-type. Thus, various modifications are possible.

As in the above, in the solar cell 100 according to the embodiment of the invention, a p-n junction or a back surface field structure are formed by a dopant layer such as the emitter layer 20 or the back surface field layer 30, thereby improving photoelectric conversion in the solar cell 100. In the embodiment of the invention, out-diffusion can be prevented and the properties of the dopant layer can be enhanced when a dopant layer such as the emitter layer 20 or back surface field layer 30 is formed, and this will be described in detail with reference to FIG. 2, and FIGS. 3a to 3h.

Figure 2:
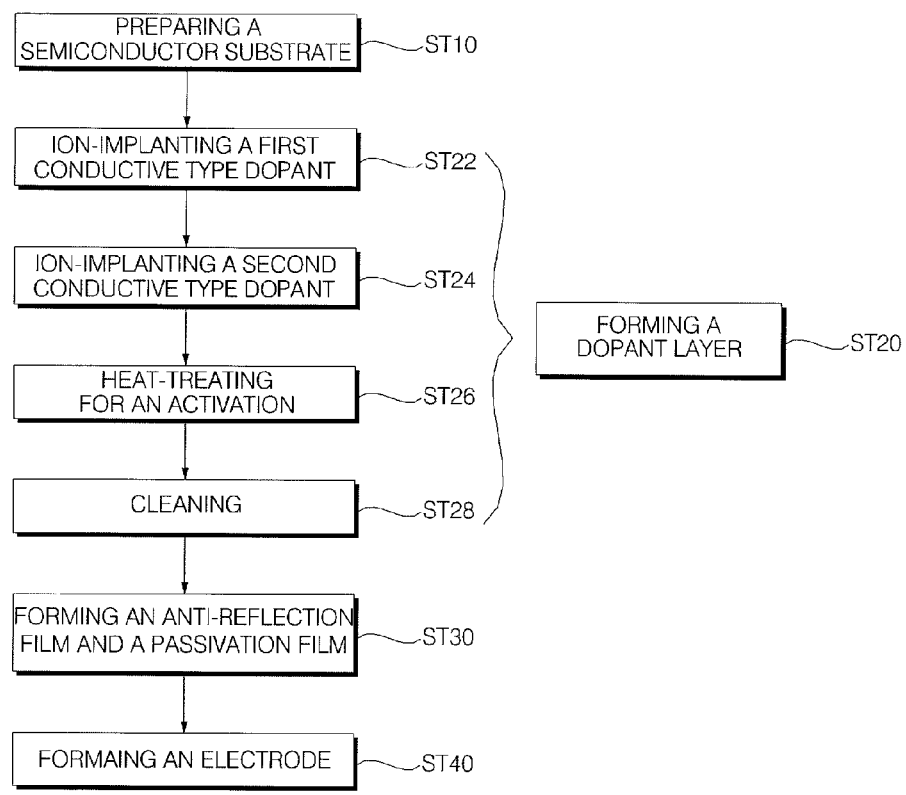
FIG. 2 is a block diagram for illustrating a method for manufacturing a solar cell according to an embodiment of the invention.

FIG. 2 is a block diagram for illustrating a method for manufacturing a solar cell according to an embodiment of the invention. FIGS. 3a to 3h are cross-sectional views for illustrating the method for manufacturing the solar cell according to the embodiment of the invention.

Referring to FIG. 2, a method for manufacturing a solar cell according to the embodiment includes an operation ST10 for preparing a semiconductor substrate, an operation ST20 for forming a dopant layer, an operation ST30 for forming an anti-reflection film and a passivation film, and an operation ST40 for forming an electrode.

In this instance, the operation ST20 for forming the dopant layer includes an operation ST22 for ion-implanting a first conductive type dopant, an operation ST24 for ion-implanting a second conductive type dopant, an operation ST26 for heat-treating for an activation, and an operation ST28 for cleaning. In the descriptions and drawings, the first and second conductive type dopants are heat-treated for an activation at the same time, and thus, the process is simplified. However, the embodiments of the invention are not limited thereto and various modifications are possible, and this will be described in more detail later.

The method for manufacturing the solar cell will be described in more detail with reference to FIGS. 3a to 3h.

Figure 3A:
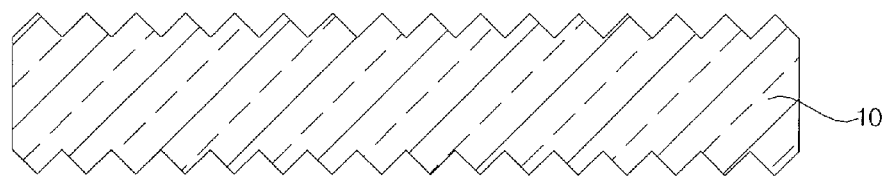
FIGS. 3a to 3h are cross-sectional views for illustrating the method for manufacturing the solar cell according to the embodiment of the invention.

First, as shown in FIG. 3a, in the operation ST10 for preparing the semiconductor substrate, a semiconductor substrate 10 having a second conductive type dopant is prepared. The front and back surfaces of the silicon semiconductor substrate 10 may be textured to have protruded and/or dented portions of various shapes (or to have an uneven surface). For the texturing method, a wet etching method or a dry etching method may be used. In the wet etching method, the substrate 10 may be dipped into a texturing solution. According to the wet etching method, the process time can be short. In the dry etching method, the surface of the semiconductor substrate 10 is etched by a diamond drill or a laser. In the dry etching method, the protruded and/or dented portions can be uniformly formed, though the semiconductor substrate 10 may be damaged and the process time may be long. Alternatively, one of the front and back surfaces of the silicon semiconductor substrate 10 may be textured by a reactive ion etching. Accordingly, the semiconductor substrate 10 may be textured by one or more of various methods.

Next, as shown in FIGS. 3b to 3f, an emitter layer 20 and a back surface field layer 30 that are dopant layers are formed. This will be described in more detail.

Figure 3B:
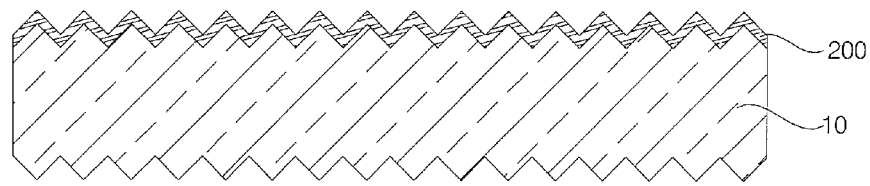

As shown in FIG. 3b, in the operation ST22 for ion-implanting the first conductive type dopant, a first layer 200 is formed by ion-implanting a first conductive type dopant to a front surface of a semiconductor substrate 10.

Figure 3C:
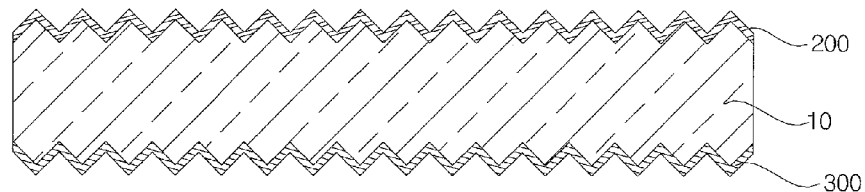

Next, as shown in FIG. 3c, the operation ST24 for ion-implanting the second conductive type dopant, a second layer 300 is formed by ion-implanting a second conductive type dopant to a back surface of the semiconductor substrate 10.

Figure 3D:
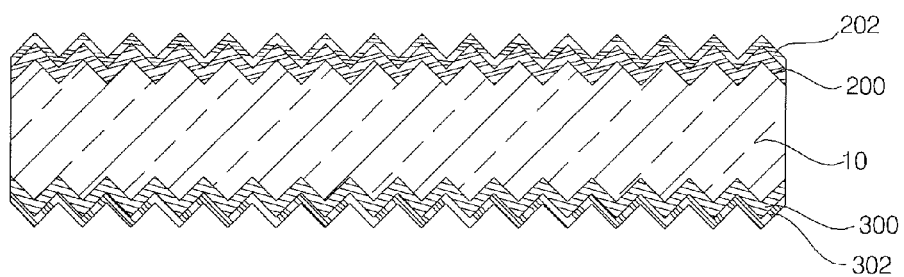
Figure 3E:
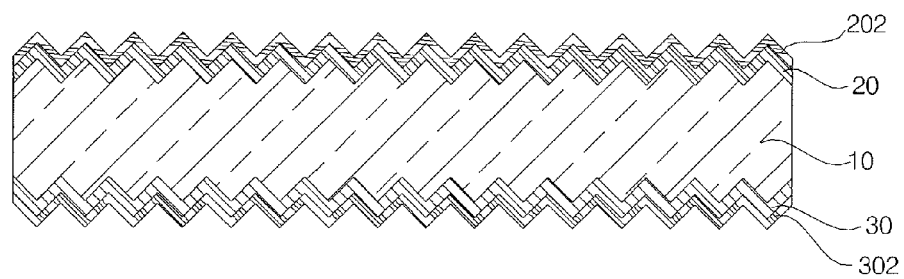

Next, as shown in FIGS. 3d and 3e, in the operation ST26 for heat-treating for the activation, the first conductive type dopant ion-implanted in the operation ST22 for ion-implanting the first conductive type dopant and the second conductive type dopant ion-implanted in the operation ST24 for ion-implanting the second conductive type dopant are activated by heat-treating for the activation that anneals the semiconductor substrate 10. Hereby, the emitter layer 20 and the back surface field layer 30 that are the dopant layers are formed. This will be described in more detail.

When the first and second conductive type dopants are ion-implanted to the semiconductor substrate 10, the first and second conductive type dopants are not activated since the dopant are not positioned at the lattice sites. By annealing the semiconductor substrate 10, the first and second conductive type dopants move to the lattice sites and are activated. By the activation, the emitter layer 20 is formed from the first layer 200 formed at the front surface of the semiconductor substrate 10, and the back surface field layer 30 is formed from the second layer 300 formed at the back surface of the semiconductor substrate 10.

In this instance, in the operation ST26 for heat-treating for the activation, anti-out-diffusion films 202 and 302 is formed for preventing out-diffusion of dopants at a temperature lower than the first temperature under a first gas atmosphere (FIG. 3d), and then, the semiconductor substrate 10 is heat-treated at the first temperature that is a temperature for the activation (FIG. 3e).

Figure 4:
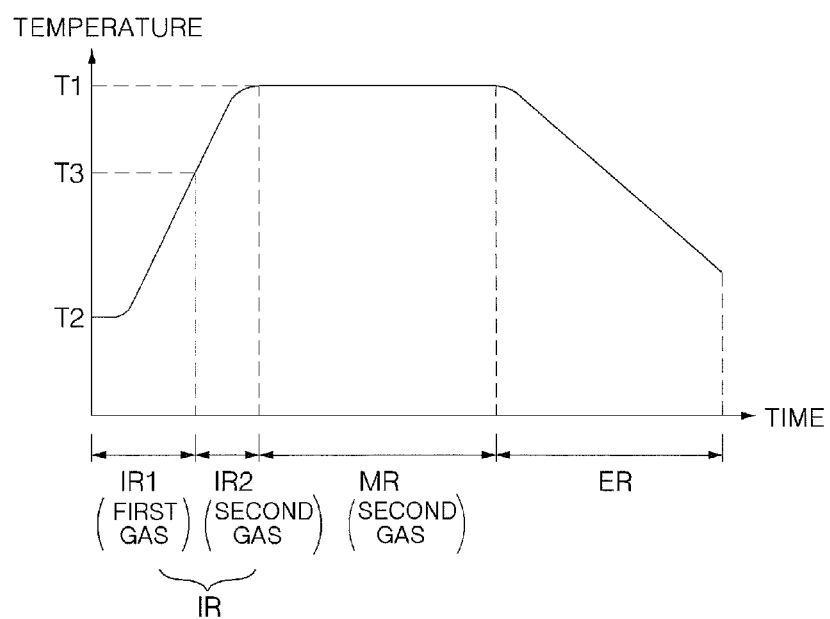
FIG. 4 is a graph illustrating a temperature with respect to time in a step for heat-treating for an activation of the method for manufacturing the dopant layer according to the embodiment of the invention.

The specific temperature and condition of the supplied gas in the operation ST26 for heat-treating for the activation will be described in more detail with reference to FIG. 4. FIG. 4 is a graph illustrating a temperature with respect to time in the operation ST26 for heat-treating for the activation of the method for manufacturing the dopant layer according to the embodiment of the invention.

With reference to FIG. 4, the operation ST26 for heat-treating for the activation according to the embodiment includes an initial region (or initial duration) IR and a maintaining region (or maintaining duration) MR. In the initial region IR, a temperature increases from a second temperature T2 lower than a first temperature T1, which is the temperature for the activation, to the first temperature T1. In the maintaining region, the first temperature T1 is maintained for a predetermined time. Also, the operation ST26 for heat-treating for the activation may include a finishing region (or finishing duration) ER where a temperature decreases from the first temperature T1 to a temperature lower than the first temperature T1 after the maintaining region ER. In this instance, the initial region IR includes a first initial region (or first initial duration) IR1 and a second initial region (second initial duration) IR2. In the first initial region IR1, a temperature increases from the second temperature T2 to a third temperature T3. In the second region IR2, a temperature increases from the third temperature T3 to the first temperature T1.

As in the above, in the operation ST26 for heat-treating for the activation, the semiconductor substrate (10 of FIG. 3d) is inserted into a heat-treating apparatus which temperature is the second temperature T2 lower than the first temperature T1 that is the temperature for the activation. Then, the temperature increases to the first temperature T1, and the heat-treatment for the activation is performed at the first temperature T1. Then, the temperature decreases to a temperature lower than the first temperature T1. If the semiconductor substrate 10 is inserted into the heat-treating apparatus which temperature is the first temperature T1 that is the temperature for the activation, the semiconductor substrate 10 may be damaged or broken by a rapid temperature change. Also, if an initial temperature of the heat-treating apparatus is a room temperature, much time is necessary to increase from the room temperature to the first temperature T1. Thus, the heat-treating is started at the second temperature T2 lower than the first temperature T1 in order to prevent a damage of the semiconductor substrate 10 and to minimize the process time.

For example, the first temperature T1 that is the temperature for the activation may in a range of about 950° C. to 1300° C. When the first temperature T1 is higher than about 1300° C., the semiconductor substrate 10 may be damaged and the manufacturing cost may be increased due to a high temperature. When the first temperature T1 is lower than 950° C., the first and/or second conductive type dopants may be insufficiently activated.

For example, the second temperature T2 may in a range of about 650° C. to 850° C. When the second temperature T2 is higher than about 850° C., the semiconductor substrate 10 may be damaged and the manufacturing cost may be increased due to a high temperature. When the second temperature T2 is lower than 650° C., the process time of the initial region IR may be increased and the productivity may be reduced.

However, the embodiments of the invention are not limited the above temperature. Thus, the first temperature T1 and the second temperature T2 may be varied.

In the embodiment of the invention, anti-out-diffusion films (202 and 302 of FIG. 3d) are formed by supplying the first gas in at least a region (in which the temperature increases to the third temperature T3 lower than the first temperature T1) of the initial region IR (in which the temperature increases from the second temperature T2 to the first temperature T1). Then, the heat-treating for the activation is performed at the first temperature T1. Hereby, in the maintaining region MR, the heat-treating for the activation can be performed in the state that out-diffusion of the dopants doped to the semiconductor substrate 10 is prevented or reduced by the anti-out-diffusion films 202 and 302.

More particularly, the anti-out-diffusion films 202 and 302 are formed by supplying the first gas in the first initial region IR1 in which temperature increases from the second temperature T2 to the third temperature T3, as shown in FIG. 3d. When the first temperature T1 is in a range of about 950° C. to 1300° C. and the second temperature T2 is in a range of about 650° C. to 850° C., the third temperature T3 may be in a range of about 870° C. to 900° C. The third temperature T3 is determined or set to be higher than the second temperature T2 and not to thicken the anti-out-diffusion films 202 and 302 excessively. However, the embodiments of the invention are not limited thereto and the third temperature T3 may be varied.

By supplying the first gas in the first initial region IR1 (that is, at a temperature of about 650° C. to 900° C.), the anti-out-diffusion films 202 and 302 are formed on surfaces of the semiconductor substrate 10. The first gas may be a material suitable for forming a film by a reaction with a material (that is, silicon) included in the semiconductor substrate 10. For example, the first gas may be oxygen suitable for forming a silicon oxide film by the reaction with the silicon of the semiconductor substrate 10. In this instance, each of the anti-out-diffusion films 202 and 302 includes an oxide film (more particularly, the silicon oxide film).

In the first initial region IR1, another gas (for example, nitrogen) may be supplied along with the oxygen. If the oxygen that is the first gas is supplied only, the anti-out-diffusion films 202 and 302 may thicken excessively. This problem may be worsened when a number of the semiconductor substrate 10 that is processed at a same process or time is large and an amount of the gas supplied to the heat-treating apparatus increases. Thus, the nitrogen along with the oxygen is supplied as necessary, and thus, the anti-out-diffusion films 202 and 302 having a suitable thickness may be formed on the semiconductor substrate 10.

The anti-out-diffusion films 202 and 302 may have thicknesses of about 0.1 nm to 20 nm (more particularly, about 1 nm to 5 nm). When the anti-out-diffusion films 202 and 302 may be larger than about 20 nm, the process time may increase, and thus, the productivity may decrease and the properties of the solar cell 100 may be deteriorated. When the anti-out-diffusion films 202 and 302 is smaller than about 0.1 nm, the effect for preventing the out-diffusion may be insufficient because the anti-out-diffusion films 202 and 302 are thin.

The process time of the first initial region IR1 may be about 1 minute to 60 minutes (for example, 5 minutes to 60 minutes, and more particularly, 5 minutes to 20 minutes). When the process time is smaller than about 1 minute, the thicknesses of the anti-out-diffusion films 202 and 302 may be insufficient. When the process time is larger than about 60 minutes, the process time increases, the thicknesses of the anti-out-diffusion films 202 and 302 may be thickened excessively, and the properties of the solar cell may be deteriorated. The process time of the first initial region IR1 may be 5 minutes to 20 minutes when the thicknesses of the anti-out-diffusion films 202 and 302 and the properties of the solar cell 100 are considered. However, the embodiments of the invention are not limited thereto. The process time may be varied in consideration with the temperature increase speed of the first initial region IR1 and thicknesses of the anti-out-diffusion films 202 and 302.

In the second initial region IR2 in which temperature increases from the third temperature T3 to the first temperature T1, a second gas different from the first gas is supplied. More particularly, the second gas has reactivity with the semiconductor substrate 10 less than that of the first gas. Thereby, the anti-out-diffusion films 202 and 302 are prevented from being thickened excessively. The second gas may include the nitrogen having a relatively small reactivity with the semiconductor substrate 10.

As in the above, the embodiment includes the second initial region IR2 where the second gas is supplied. However, the embodiments of the invention are not limited thereto. Thus, the second initial region IR2 may be omitted, and the first gas is supplied over the initial region IR.

Also, in the maintaining region MR where the first temperature T1 is maintained, the heat-treating for the activation is performed at the temperature suitable to the heat-treating for the activation. Then, as shown in FIG. 3e, the emitter layer 20 is formed from the first layer 200 formed at the front surface of the semiconductor substrate 10, and the back surface field layer 30 is formed from the second layer 300 formed at the back surface of the semiconductor substrate 10 by the activation. In this instance, the maintaining region MR may be performed under the nitrogen atmosphere by supplying the second gas (for example, the nitrogen).

In this instance, the process time of the maintaining region MR may be longer than the process time the initial region (IR) (particularly, the first initial region IR1). This is for appropriately controlling the anti-out-diffusion films 202 and 302 and for activating the dopants sufficiently.

In addition, after the maintaining region MR, the finishing region ER for decreasing the temperature to a temperature lower than the first temperature T1 may be performed. Accordingly, when the semiconductor substrate 10 is pulled from the heat-treating apparatus, the semiconductor substrate 10 may be prevented from being damaged or broken. In the finishing region ER, the second gas may be supplied.

In the embodiment of the invention, in the at least one region of the initial region IR1 performed before the maintaining region MR, the anti-out-diffusion films 202 and 302 are formed. Accordingly, when substantial heat-treating for the activation is performed during the maintaining region MR, the anti-out-diffusion films 202 and 302 prevents the out-diffusion of the dopants. Therefore, the loss of the dopants can be minimized, and a doping depth of the dopants can be increased. Thus, a surface recombination velocity (SRV) at the surface of the semiconductor substrate 10 can be reduced, and a current density (Jsc) and an open-circuit voltage (Voc) of the solar cell 100 can be enhanced. Further, quantum efficiency (particularly, internal quantum efficiency) can be enhanced. Finally, properties and efficiency of the solar cell 100 can be enhanced.

Also, the anti-out-diffusion films 202 and 302 are formed by controlling gas supplied in a partial region (or partial duration) of the operation ST26 for heat-treating for the activation. Thus, an additional process for forming the anti-out-diffusion films 202 and 302 is not necessary. That is, the initial region IR where the anti-out-diffusion films 202 and 302 are formed and the maintaining region MR where substantial heat-treating for the activation are performed in the same heat-treating apparatus by a continuous process (an in-situ process). Accordingly, the process can be simplified, and the manufacturing cost can be reduced by decreasing the material cost.

On the other hand, the heat-treating for the activation is conventionally performed in the state that the anti-out-diffusion film is not formed. Thus, the ion-implanted dopants are out-diffused, and thus, the dopant loss is induced and the doping depth is insufficient. Alternatively, an additional process for forming an anti-out-diffusion film is conventionally performed on the surface of the semiconductor substrate, whereby the additional process for forming the anti-out-diffusion film is formed by a chemical oxidation using a sulfuric acid or a nitric acid. If the additional process is performed, a process is added and the process time is very long (about 20 minutes to 30 minutes), and thus, the productivity is low. Also, high acidity (particularly, similar to an acidity of an undiluted solution) of the sulfuric acid or the nitric acid should be used in order to oxidize the substrate. Thus, the material cost is increased, and thus, the productivity is deteriorated more.

That is, according to the embodiment of the invention, by forming the anti-out-diffusion films 202 and 302 in the operation ST26 for heat-treating for the activation, the surface concentration can be reduced and the doping depth can be increased by preventing the out-diffusion without an additional process. Accordingly, properties of the emitter layer 20 and the back surface field layer 30 that are the dopant layers can be enhanced. Thus, properties and efficiency of the solar cell 100 can be enhanced while increasing productivity.

In the embodiment of the invention, the anti-out-diffusion films 202 and 302 are formed to correspond to the emitter layer 20 and the back surface field layer 30. However, the embodiments of the invention are not limited thereto. Thus, only the anti-out-diffusion film 202 may be formed for the emitter layer 20, or only the anti-out-diffusion film 302 may be formed for the back surface field layer 30.

Figure 3F:
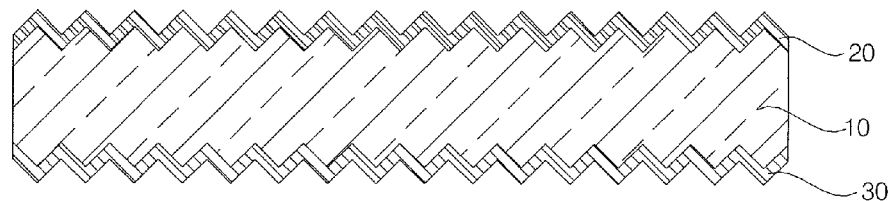

Next, as shown in FIG. 3f, in the operation ST28 for cleaning, the semiconductor substrate 10 that underwent the heat-treating for the activation is cleaned. In this instance, the anti-out-diffusion films 202 and 302 may be eliminated (or removed). In the operation ST28 for cleaning, a diluted hydrofluoric acid (diluted HF) may be used. However, the embodiments of the invention are not limited thereto. Thus, the semiconductor substrate 10 may be cleaned by using one or more of various materials.

Since the operation ST26 for heat-treating for the activation is performed at a high temperature, silicate glass (for example, boron silicate glass (BSG) or phosphorus silicate glass (PSG)) may be formed on the surfaces of the semiconductor substrate 10. The anti-out-diffusion films 202 and 302 are combined with the silicate glass, and thus, the silicate glass can be eliminated when the anti-out-diffusion films 202 and 302 are eliminated in the operation ST28 for cleaning. The properties of the solar cell 100 may be reduced when the silicate glass is remained; however, in the embodiment of the invention, the silicate glass can be eliminated by the anti-out-diffusion films 202 and 302, and thus, the properties of the solar cell 100 can be improved. In addition, an additional process for eliminating only the silicate glass is not necessary, thereby simplifying the manufacturing process.

Figure 3G:
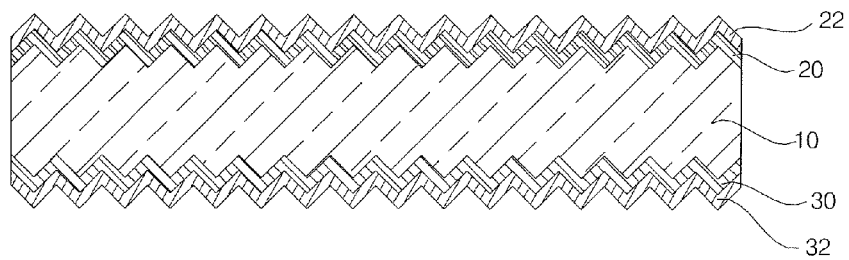

Next, as shown in FIG. 3g, in the operation ST30 for forming an anti-reflection film 22 and a passivation film 32, the anti-reflection film 22 and the passivation film 32 are formed on the front surface and the back surface of the semiconductor substrate 10, respectively.

The anti-reflection film 22 and the passivation film 32 may be formed by one or more of various methods such as vacuum evaporation, chemical vapor deposition, spin coating, screen printing, or spray coating.

Figure 3H:
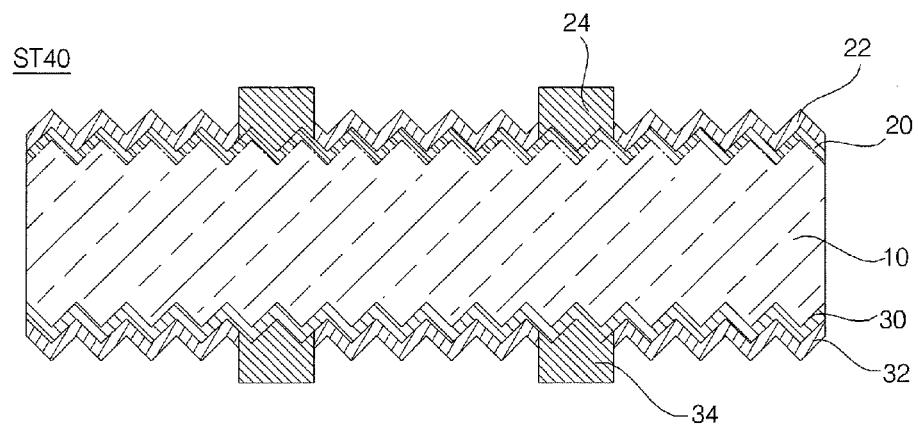

Next, as shown in FIG. 3h, in the operation ST40 for forming the electrodes 24 and 34, a first electrode 24 electrically connected to the emitter layer 20 is formed at the front surface of the semiconductor substrate 10 and a second electrode 34 electrically connected to the back surface field layer 30 (or, the semiconductor substrate 10) is formed at the back surface of the semiconductor substrate 10.

After forming an opening at the anti-reflection layer 22, the first electrode 24 may be formed inside the opening by one or more of various methods, such as a plating method or a deposition method. Also, after forming an opening at the second passivation layer 32, the second electrode 34 may be formed inside the opening by one or more of various methods, such as a plating method or a deposition method.

Alternatively, the first and second electrodes 24 and 34 may be formed by fire-through or laser firing contact of printed pastes for the first and second electrodes 24 and 34. For example, the pastes may be printed by various methods such as a screen printing method. In this instance, because the openings are naturally (or automatically) formed during the fire-through or the laser firing contact, separate operations for forming the openings are not necessary.

The detailed descriptions and the drawings are provided only for suggesting one example among various embodiments of the invention, and thus, various modifications are possible.

That is, in the embodiments of the invention, after ion-implanting the first conductive type dopant, the second conductive type dopant is ion-implanted. Then, the first and second conductive type dopants are co-activated. However, the embodiments of the invention are not limited thereto. Therefore, after ion-implanting the second conductive type dopant, the first conductive type dopant may be ion-implanted. Also, the heat-treating for an activation of the first conductive type dopant and the heat-treating for an activation of the second conductive type dopant may be performed separately. In this instance, the heat-treating for the activation can be preformed to be suitable for properties of the dopants.

Also, in the embodiments of the invention, after forming both of the anti-reflection film 22 and the passivation film 32, the first and second electrodes 24 and 34 are formed. However, the embodiments of the invention are not limited thereto. Accordingly, the anti-reflection film 22 may be formed, and then, the first electrode 24 may be formed. After that, the passivation film 32 may be formed, and then, the second electrode 34 may be formed. Alternatively, the passivation film 32 may be formed, and then, the second electrode 34 may be formed. After that, the anti-reflection film 22 may be formed, and then, the first electrode 24 may be formed In the embodiment of the invention, after forming both dopant layers (the emitter layer 20 and the back surface field layer 30), the anti-reflection film 22 and the passivation film 32 are formed. However, the embodiments of the invention are not limited thereto. Therefore, the emitter layer 20 may be formed, and then, the anti-reflection film 22 may be formed. After that, the back surface field layer 30 may be formed, and then, the passivation film 32 may be formed. Alternatively, the back surface field layer 30 may be formed, and then, the passivation film 32 may be formed. After that, the emitter layer 20 may be formed, and then, the anti-reflection film 22 may be formed.

That is, manufacturing sequence of the emitter layer 20, the back surface field layer 30, the anti-reflection film 22, the passivation film 32, the first electrode 24, and the second electrode 34 may be variously modified.

Further, the emitter layer 20 and the back surface field layer 30 are exemplified as the dopant layer. However, the embodiments of the invention are not limited thereto. In a back contact solar cell, the dopant layer may be a front surface field layer doped with a dopant of a conductive type the same as a conductive type of the semiconductor substrate.

Hereinafter, a solar cell or a method for forming a solar cell according to another embodiment of the invention will be described in more detail with reference to FIGS. 5a to 5e, and FIG. 6. In the following description, any described portions already described above will be omitted, and any portions not already described above will be described in detail. Also, the modifications of the above embodiment are applicable to the following embodiment.

FIGS. 5a to 5e are cross-sectional views for illustrating a method for manufacturing a solar cell according to another embodiment of the invention.

Figure 5A:
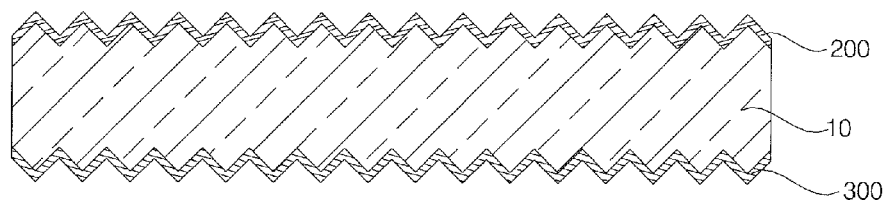
FIGS. 5a to 5e are cross-sectional views for illustrating a method for manufacturing a solar cell according to another embodiment of the invention.

As shown in FIG. 5a, a first layer 200 and a second layer 300 are formed on a semiconductor substrate 10.

Figure 5B:
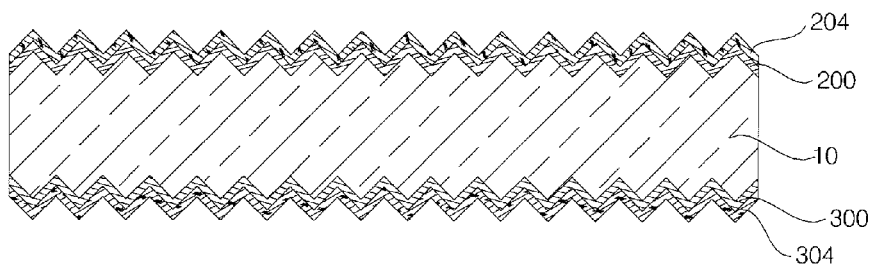

As shown in FIG. 5b, capping layers 204 and 304 are formed on the first layer 200 and the second layer 300 on the semiconductor substrate 10, respectively. The capping layers 204 and 304 are oxidation layers formed by a method using a strong acid (for example, a NAOS (nitric acid oxidation of silicon) method using a nitride acid). When the capping layers 204 and 304 are further formed as in the above, the out-diffusion of the dopants of the first layer 200 and the second layer 300 can be effectively prevented.

Figure 5C:
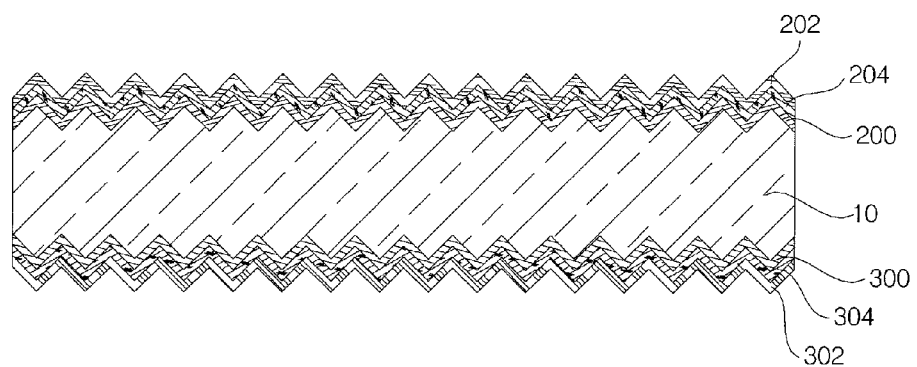

Next, as shown in FIG. 5c, an emitter layer 20 and a back surface field layer 30 are formed by activating the dopants after forming the anti-out-diffusion films 202 and 302 in an operation for heat-treating for an activation.

Figure 5D:
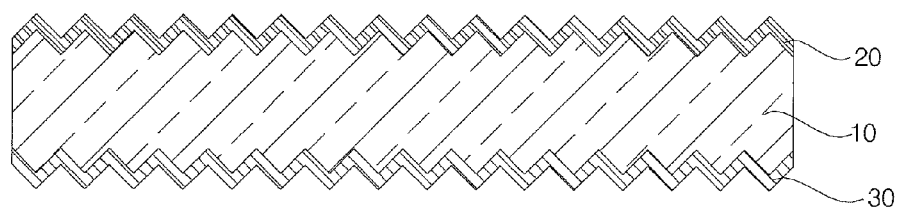
Figure 5E:
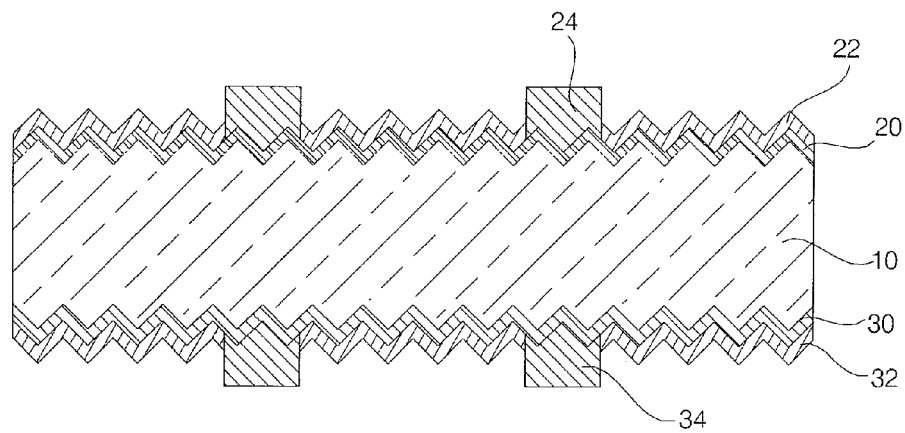

Next, as shown in FIG. 5d, the capping layers 204 and 304, and the anti-out-diffusion films 202 and 302 are eliminated in an operation for cleaning. Next, as shown in FIG. 5e, an anti-reflection film 22, a passivation film 32, a first electrode 24, and a second electrode 34 are formed.

In the embodiment of the invention, by forming an additional capping layers 204 and 304, the out-diffusion of the dopants of the first layer 200 and the second layer 300 can be effectively prevented.

Figure 6:
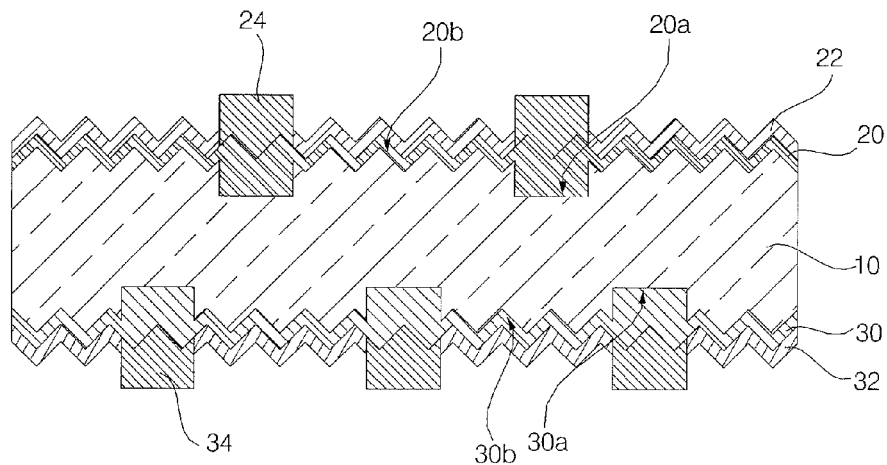
FIG. 6 is a cross-sectional view of a solar cell according to yet another embodiment of the invention.

FIG. 6 is a cross-sectional view of a solar cell according to another embodiment of the invention.

Referring to FIG. 6, in a solar cell according to the embodiment of the invention, an emitter layer 20 has a selective emitter structure and a back surface field layer 30 has a selective back surface field structure.

In the embodiment of the invention, the emitter layer 20 having the selective emitter structure includes a first portion 20a being adjacent to and being in contact with the first electrode 24, and a second portion 20b other than the first portion 20a.

The first portion 20a has a relatively high doping concentration and has a relatively low resistance, and the second portion 20b has a relatively low doping concentration and has a relatively high resistance. That is, in the embodiment of the invention, a shallow emitter can be achieved by forming the second portion 20b having the relatively high resistance at a portion where the sun light is incident between adjacent first electrodes 24, thereby enhancing the current density of the solar cell 100. In addition, contact resistance with the first electrode 24 can be reduced by forming the first portion 20a having the relatively low resistance at a portion that is in contact with the first electrode 24. That is, when the emitter layer 20 has the selective emitter structure, the efficiency of the solar cell 100 can be increased or maximized.

Thus, the dose of the first conductive type dopant at the first portion 20a may larger than the dose of the first conductive type dopant at the second portion 20b. When there is a dose difference (or to generate a dose difference) between the first portion 20a and the second portion 20b, a comb mask may be used. However, the embodiments of the invention are not limited thereto. Thus, the number of the ion-implantation process may be different at the first and second portions 20a and 20b. Other methods may be used.

The back surface field layer 30 having a selective back surface field structure includes a first portion 30a being adjacent to and being in contact with the second electrode 34, and a second portion 30b other than the first portion 30a.

The first portion 30a has a relatively high doping concentration and has a relatively low resistance, and the second portion 30b has a relatively low doping concentration and has a relatively high resistance. That is, in the embodiment of the invention, the recombination of the electrons and holes can be reduced or prevented by forming the second portion 30b having the relatively high resistance at a portion between the adjacent second electrodes 34, thereby enhancing the current density of the solar cell 100. In addition, contact resistance with the second electrode 34 can be reduced by forming the first portion 30a having the relatively low resistance at a portion that is in contact with the second electrode 34. That is, when the back surface field layer 30 has the selective back surface field structure, the efficiency of the solar cell 100 can be increased or maximized.

Thus, the dose of the second conductive type dopant at the first portion 30a may larger than the dose of the second conductive type dopant at the second portion 30b. When there is a dose difference (or to generate a dose difference) between the first portion 30a and the second portion 30b, a comb mask may be used. However, the embodiments of the invention are not limited thereto. Thus, the number of the ion-implantation process may be different at the first and second portions 30a and 30b. Other methods may be used.

As such, in the embodiment of the invention, the emitter layer 20 and the back surface field layer 30 have a selective structure including portions with different resistances, thereby enhancing the efficiency of the solar cell.

In the embodiment of the invention, both of the emitter layer 20 and the back surface field layer 30 have the selective structure. However, the embodiments of the invention are not limited thereto. Therefore, one of the emitter layer 20 and the back surface field layer 30 may have the selective structure.

Hereinafter, the embodiments of the invention will be described in more detail through experimental embodiments. The experimental embodiments are provided only for illustrative purpose of the embodiments of the invention, and the embodiments of the invention are not limited thereto.

Experimental Embodiment 1

An n-type semiconductor substrate was prepared. Boron as a first conductive type dopant was ion-implanted to the front surface of the semiconductor substrate, and phosphorus as a second conductive type dopant was ion-implanted to the back surface of the semiconductor substrate. The semiconductor substrate to which the ion-implanting was performed was put to a heat-treating apparatus for an activation. The temperature increased from 720° C. to 900° C. while supplying oxygen for 50 minutes, thereby forming an oxide film. Then, the temperature increased to 1050° C. and was maintained while supplying nitrogen, and the boron and the phosphorus were activated, thereby forming an emitter layer and a back surface field layer. After that, the oxide film was eliminated by cleaning using a diluted HF.

An anti-reflection film was formed on the front surface of the semiconductor substrate, and a passivation film was formed on the back surface of the semiconductor substrate. Then, a first electrode electrically connected to the emitter layer and a second electrode electrically connected to the back surface field layer were formed, and a solar cell was manufactured.

Experimental Embodiment 2

A solar cell was manufactured by the same method as Experimental Embodiment 1 except for a method forming the oxide film. In Experimental Embodiment 2, capping layers of oxide were formed by using a nitric acid for 25 minutes after ion-implanting the first and second conductive type dopants, and then, an oxide film was formed in the heat-treating apparatus for the activation for 25 minutes. That is, Experimental Embodiment 2 is different from Experimental Embodiment 1 in that the capping layer existed along with the oxide film as the anti-out-diffusion film and the process time for forming the oxide film in the heat-treating for the activation was 25 minutes. In the step for cleaning, the capping layer, along with the oxide film, was eliminated.

Experimental Embodiment 3

A solar cell was manufactured by the same method as Experimental Embodiment 1 except that the oxide film was formed for 10 minutes in the heat-treating for the activation.

Experimental Embodiment 4

A solar cell was manufactured by the same method as Experimental Embodiment 1 except that the oxide film was formed for 5 minutes in the heat-treating for the activation.

Comparative Example

An n-type semiconductor substrate was prepared. Boron as a first conductive type dopant was ion-implanted to the front surface of the semiconductor substrate, and phosphorus as a second conductive type dopant was ion-implanted to the back surface of the semiconductor substrate. Capping layers of oxide were formed on surfaces of the semiconductor substrate by using a nitric acid for 25 minutes. The semiconductor substrate to which the ion-implanting was performed was put to a heat-treating apparatus for an activation. The temperature increased from 720° C. to 1050° C. and was maintained at 1050° C. while supplying nitrogen, and the boron and the phosphorus were activated, thereby forming an emitter layer and a back surface field layer. After that, the oxide film was eliminated by cleaning using a diluted HF.

An anti-reflection film was formed on the front surface of the semiconductor substrate, and a passivation film was formed on the back surface of the semiconductor substrate. Then, a first electrode electrically connected to the emitter layer and a second electrode electrically connected to the back surface field layer were formed, and a solar cell was manufactured.

Figure 7:
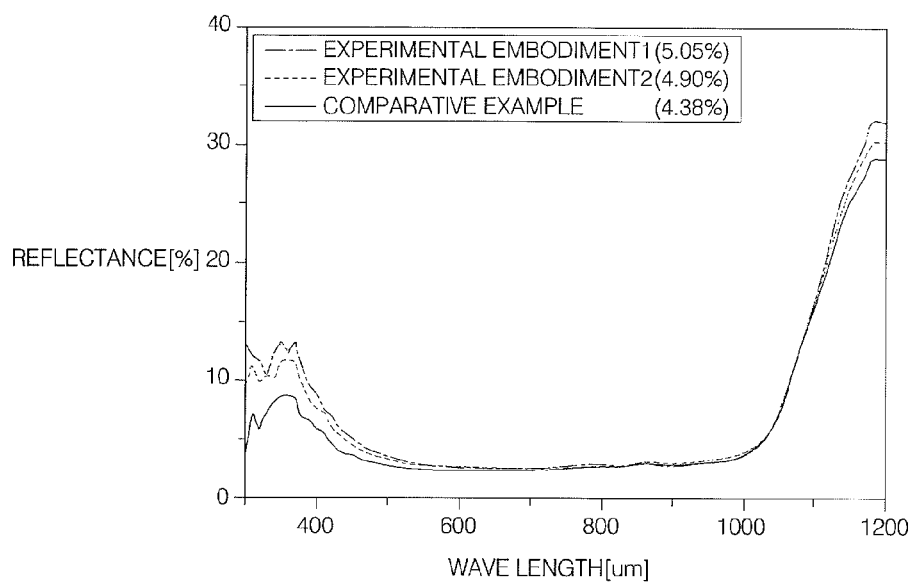
FIG. 7 is a graph of reflectance with respect to wavelength of solar cells manufactured by Experimental Embodiments 1 and 2, and Comparative Example.
Figure 8:
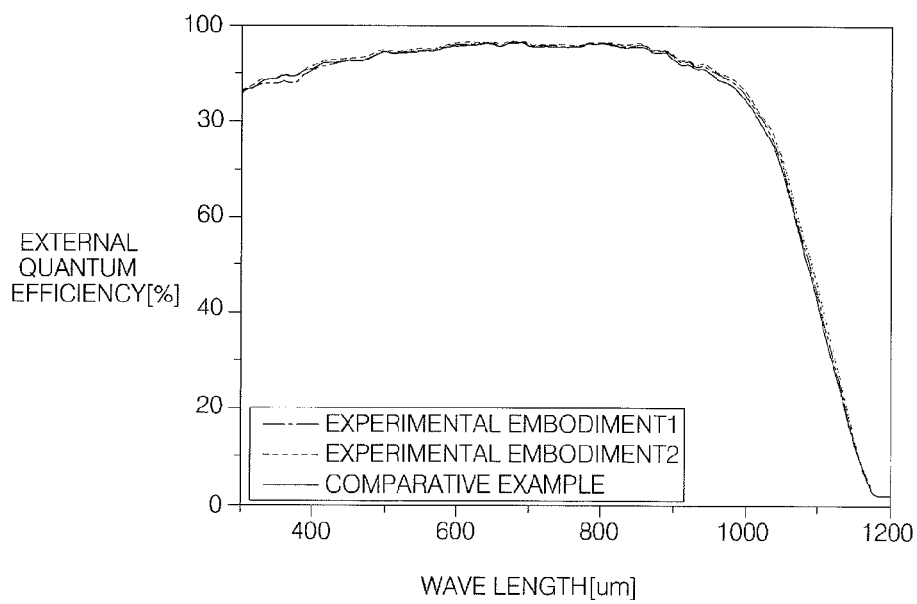
FIG. 8 is a graph of external quantum efficiency with respect to wavelength of solar cells manufactured by Experimental Embodiments 1 and 2, and Comparative Example.
Figure 9:
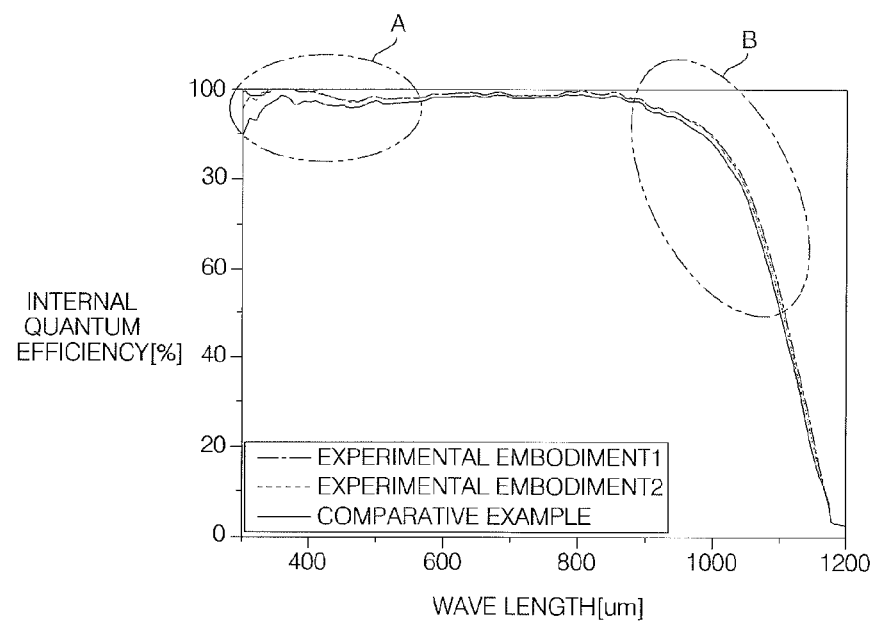
FIG. 9 is a graph of internal quantum efficiency with respect to wavelength of solar cells manufactured by Experimental Embodiments 1 and 2, and Comparative Example.
Figure 10:
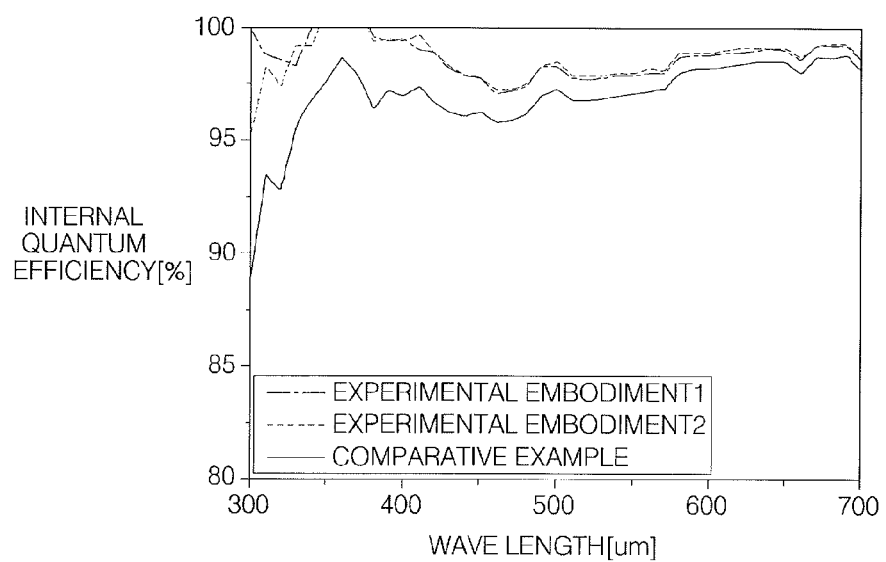
FIG. 10 is an enlarged view of portion A of FIG. 9.
Figure 11:
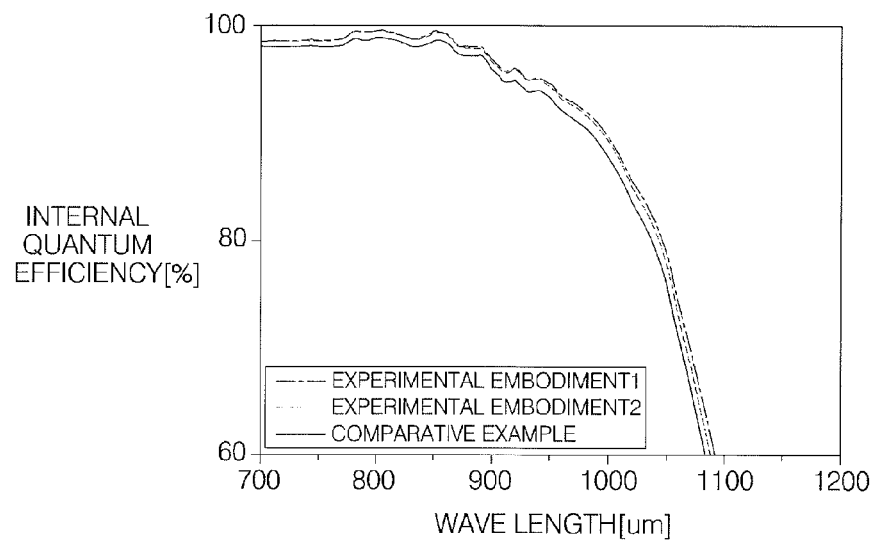
FIG. 11 is an enlarged view of portion B of FIG. 9.

Reflectance with respect to wavelength, external quantum efficiency, and internal quantum efficiency of the solar cells manufactured by Experimental Embodiments 1 and 2, and Comparative Example were detected. The results are shown in FIGS. 7, 8, and 9, respectively. Also, FIGS. 10 and 11 are enlarged views of portions A and B of FIG. 9, respectively.

Referring to FIG. 7, it can be seen that reflectance of the solar cells according to Experimental Embodiments 1 and 2 in short wavelengths and in long wave lengths is different from reflectance of the solar cell according to Comparative Example. Accordingly, it can be seen that morphology of the surfaces of the solar cells of Experimental Embodiments 1 and 2 are changed. For reference, although the reflectance of the solar cells of Experimental Embodiments 1 and 2 increases slightly, it does not affect the efficiency of the solar cells.

Referring to FIGS. 8 and 9, the solar cells of Experimental Embodiments 1 and 2 have highly-enhanced quantum efficiency (particularly, internal quantum efficiency), compared with Comparative Example. As shown in FIG. 10, the solar cells of Experimental Embodiments 1 and 2 have enhanced internal quantum efficiency in the short wavelengths, compared with Comparative Example. As shown in FIG. 11, the solar cells of Experimental Embodiments 1 and 2 have enhanced internal quantum efficiency in the long wavelengths, compared with Comparative Example. When the current density (Jsc) is calculated by the internal quantum efficiency, the current density in wavelengths of 300~800 nm of Experimental Embodiments 1 and 2 increases by about 0.15 mA/cm$^2$, and the current density in wavelengths of 800~1200 nm of Experimental Embodiments 1 and 2 increases by about 0.22 mA/cm$^2$.

Figure 12:
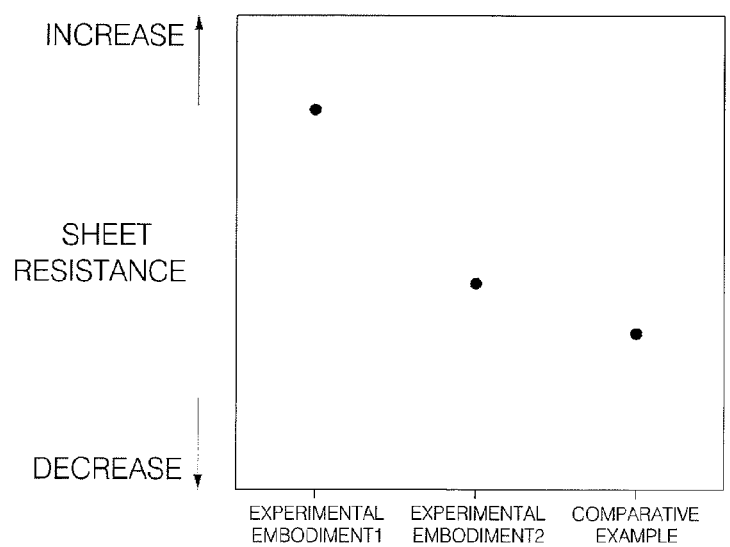
FIG. 12 is a graph of sheet resistances of emitter of solar cells according to Experimental Embodiments 1 and 2, and Comparative Example.
Figure 13:
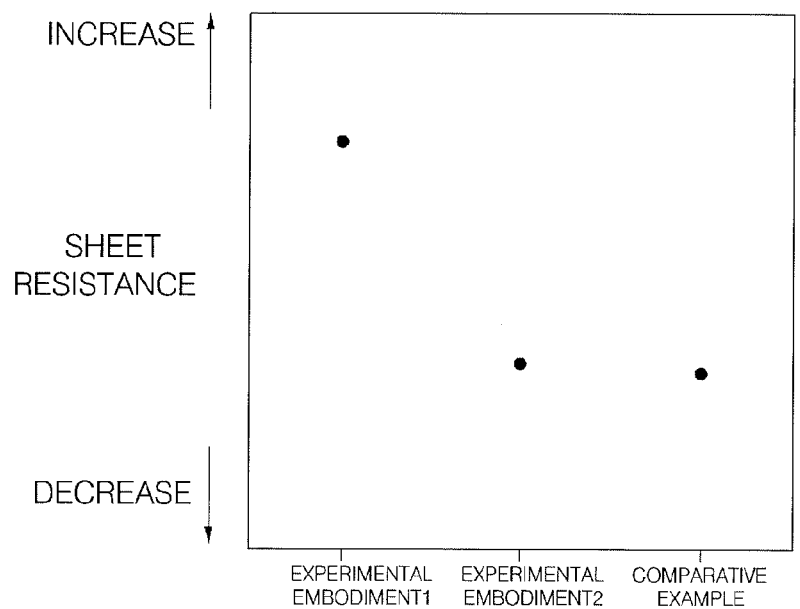
FIG. 13 is a graph of sheet resistances of back surface field layers of solar cells according to Experimental Embodiments 1 and 2, and Comparative Example.
Figure 14:
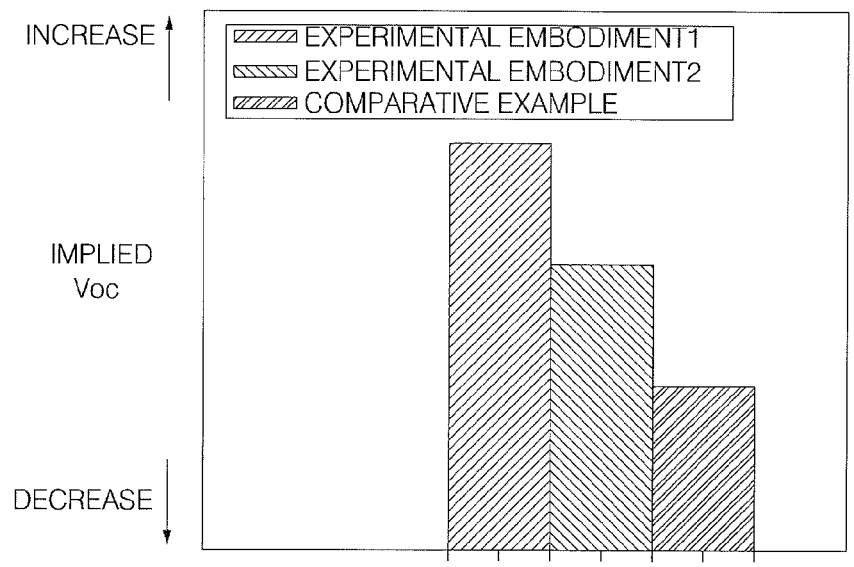
FIG. 14 is a graph of implied Voc of back surface field layers of solar cells according to Experimental Embodiments 1 and 2, and Comparative Example.

Also, the sheet resistances of the emitter layers of the solar cells according to Experimental Embodiments 1 and 2, and Comparative Example were measured, and the results are shown in FIG. 12. The sheet resistances of the back surface field layers of the solar cells according to Experimental Embodiments 1 and 2, and Comparative Example were measured, and the results are shown in FIG. 13. The implied Voc of the solar cells according to Experimental Embodiments 1 and 2, and Comparative Example were measured, and the results are shown in FIG. 14. The sheet resistances and the implied Voc are shown as relative values.

Referring to FIGS. 12 and 13, it can be seen that the solar cells according to Experimental Embodiments 1 and 2 has high sheet resistances of the emitter layer and the back surface field layer, Compared with Comparative Example. Accordingly, the surface recombination velocity can be reduced. In addition, referring to FIG. 14, it can be seen that the implied Voc of the solar cells according to Experimental Embodiments 1 and 2 is improved, compared with Comparative Example. Accordingly, according Experimental Embodiments 1 and 2, various properties of the dopant layers can be improved and efficiency of the solar cells can be enhanced.

Figure 15:
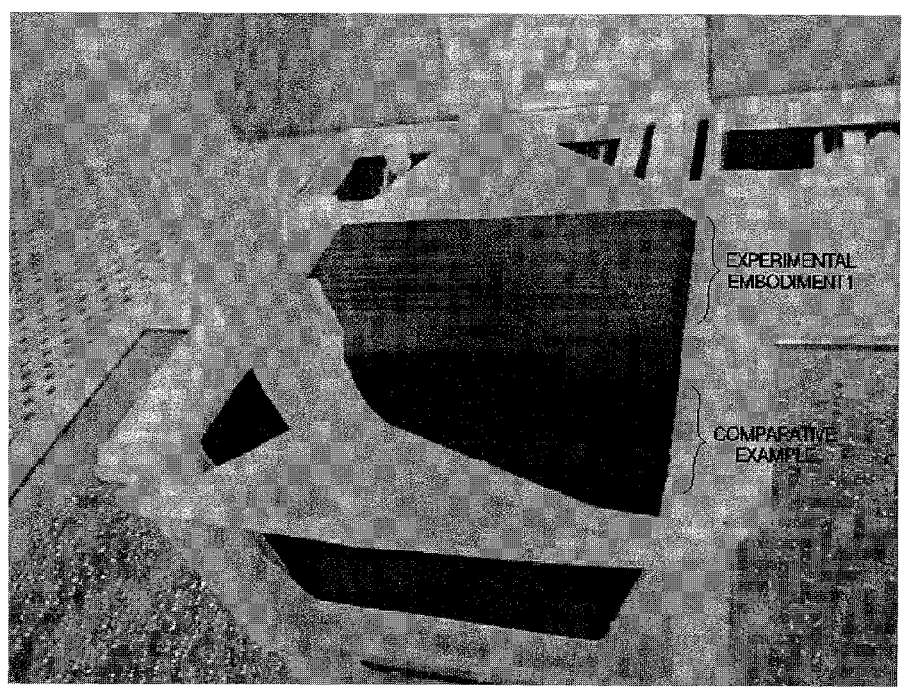
FIG. 15 shows six solar cells manufactured according to Comparative Example and twelve solar cells manufactured according to Experimental Embodiment 1.

Furthermore, six solar cells were manufactured according to Comparative Example and twelve solar cells were manufactured according to Experimental Embodiment 1. In the solar cells, the emitter layers were formed and the cleansings were performed. The solar cells are shown in FIG. 15. As shown in FIG. 15, in the solar cells according to Comparative Example, chemical materials (for example, boron silicate glass, (BSG)) are remained on the surfaces of the substrate. On the other hand, in the solar cells according to Experimental embodiment 1, chemical materials (for example, boron silicate glass, BSG)) are not remained on the surfaces of the substrate. This is because the silicate glass was also eliminated when the anti-out-diffusion film was eliminated. Therefore, according to Experimental Embodiment 1, the silicate glass can be eliminated, thereby enhancing properties of the solar cell.

In addition, measured values of thicknesses of the oxide films (that is, the anti-out-diffusion film) of the solar cells according to Experimental Embodiments 3 and 4 are shown in Table 1, along with theoretical values.

TABLE 1

|  | Theoretical value [nm] | Measured value [nm] |
|---|---|---|
| Experimental Embodiment 3 | 1.6 | 5.168 |
| Experimental Embodiment 4 | 0.8 | 4.838 |

Referring to Table 1, it can be seen that the oxide films according to Experimental Embodiments 3 and 4 have thickness larger than the theoretical values. That is, according to the embodiment of the invention, the oxide film having sufficient thickness can be formed by a simple process (that is, supplying the oxygen in the step for heat-treating for the activation), and thus, the oxide film can act as the anti-out-diffusion film.

Also, open-circuit voltages (Voc), current densities (Jsc), fill factors, and efficiencies of forty six solar cells manufactured according to Experimental Embodiment 3 and forty four solar cells manufactured according to Comparative Example were measured, and average values thereof are shown in Table 2.

TABLE 2

|  | Open-circuit voltage (Voc) | Current density (Jsc) | Fill factor [%] | Efficiency [%] |
|---|---|---|---|---|
| Experimental Embodiment 3 | 650.4 | 39.33 | 79.17 | 20.25 |
| Comparative Example | 647.6 | 39.26 | 79.03 | 20.09 |

Referring to Table 2, it can be seen that the solar cells according to Experimental Embodiment 3 have enhanced open-circuit voltage, current density, fill factor, and efficiency. Particularly, the open-circuit voltage in Experimental Embodiment 3 is larger than that in Comparative Example by about 3 mV, and is very superior than that in Comparative Example. Also, the efficiency in Experimental Embodiment 3 is larger than that in Comparative Example by about 0.15%, and is superior than that in Comparative Example.

Figure 16:
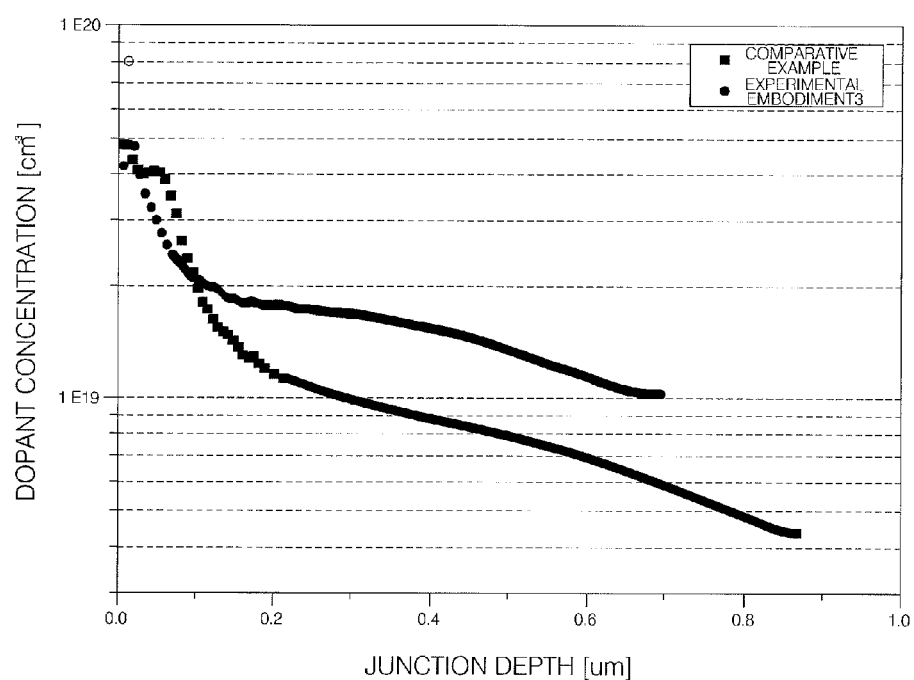
FIG. 16 is a graph of dopant concentration with respect to junction depths of emitter layers in solar cells manufactured according to Experimental Embodiment 3 and Comparative Example.

The dopant concentration with respect to the junction depths of the emitter layers in the solar cells manufactured according to Experimental Embodiment 3 and Comparative Example were measured. The result is shown in FIG. 16. In this instance, dopant amounts of the emitter layers are shown in Table. 3. An electrochemical capacitance-voltage (ECV) profile was measured and then was compensated by using an area and a sheet resistance. After the compensating the profile, the dopant amounts in Table 3 is calculated.

TABLE 3

|  | Dopant amount |
|---|---|
| Experimental Embodiment 3 | $1.24 \times 10^{15}$ |
| Comparative Example | $1.02 \times 10^{15}$ |

Referring to Table 3, it can be seen that the dopant amount in Experimental Embodiment 3 is larger than the dopant amount in Comparative Example. Also, referring to FIG. 16, it can be seen that the dopants are uniformly distributed with a higher concentration at the surface of the semiconductor substrate (that is, the surface of the emitter layer) in Experimental Embodiment 3 than Comparative Example. That is, it is can be expected that more carriers can be formed and be collected at the surface of the semiconductor substrate and the efficiency of the solar cell can be enhanced. It is expected that this is because the oxide film formed by the thermal method has a density larger than a density of the oxide film formed by the chemical method.

According to the embodiment of the invention, by forming the anti-out-diffusion films in the step for heat-treating for the activation, the surface concentration can be reduced and the doping depth can be increased by preventing the out-diffusion without an additional process. Accordingly, properties of the dopant layers (for example, the emitter layer, the front surface field layer, and the back surface field layer) can be enhanced. Thus, properties and efficiency of the solar cell can be enhanced while increasing productivity.

Certain embodiments of the invention have been described. However, the invention is not limited to the specific embodiments described above, and various modifications of the embodiments are possible by those skilled in the art to which the invention belongs without leaving the scope defined by the appended claims.

What is claimed is:

1. A method for manufacturing a dopant layer of a solar cell, the method comprising:
    ion-implanting a dopant to a substrate; and
    heat-treating for an activation of the dopant,
    wherein the heat-treating for the activation comprises:
    an initial duration having a first initial duration for forming an anti-out-diffusion film under a first gas atmosphere comprising oxygen; and
    a maintaining duration for activating the dopant at a first temperature after the initial duration,
    wherein the initial duration is composed of a temperature increase region of the heat-treating for the activation under a temperature lower than the first temperature before the maintaining duration,
    wherein the maintaining duration is performed only after the first initial duration,
    wherein the first initial duration and the maintaining duration are parts of an in-situ process,
    wherein the initial duration further comprises a second initial duration after the first initial duration,
    in the first initial duration, a temperature increases from a second temperature lower than the first temperature to a third temperature higher than the second temperature and lower than the first temperature,
    in the second initial duration, a temperature increases from the third temperature to the first temperature, and
    wherein a second gas atmosphere different from the first gas atmosphere is supplied in the second initial duration.

2. The method according to claim 1, wherein the anti-out-diffusion film comprises an oxide film.

3. The method according to claim 2, wherein nitrogen is supplied with the oxygen in the first initial duration.

4. The method according to claim 1, wherein the maintaining duration is performed under the second gas atmosphere different from the first gas atmosphere.

5. The method according to claim 4, wherein the second gas atmosphere comprises nitrogen.

6. The method according to claim 1, wherein a process time of the maintaining duration is longer than a process time of the first initial duration.

7. The method according to claim 1, wherein a process time of the first initial duration is in a range of about 1 minute to about 60 minutes.

8. The method according to claim 1, wherein the second gas atmosphere is supplied in the maintaining duration.

9. The method according to claim 1, wherein the heat-treating for the activation further comprises a finishing duration where a temperature decreases after the maintaining duration.

10. The method according to claim 1, wherein the initial duration and the maintaining duration are consecutively performed in a same heat-treating apparatus.

11. The method according to claim 1, wherein the first temperature is in a range of about 950° C. to 1300° C.

12. The method according to claim 1, wherein a temperature in the first initial duration is in a range of about 650° C. to 900° C.

13. The method according to claim 1, wherein the anti-out-diffusion film has a thickness of about 0.1 nm to 20 nm.

14. The method according to claim 1, further comprising cleaning the substrate after the heat-treating for the activation,
    wherein the anti-out-diffusion film is eliminated in the cleaning.

15. The method according to claim 14, wherein silicate glass is formed on a surface of the substrate in the heat-treating for the activation, and
    the silicate glass formed on the surface of the substrate is eliminated with the anti-out-diffusion film during the cleaning.

16. The method according to claim 1, further comprising forming a capping layer on a surface of the substrate between the ion-implanting and the heat-treating for the activation,
    wherein the anti-out-diffusion film is formed on the capping layer during the heat-treating for the activation.

17. A method for manufacturing a solar cell, the method comprising:
    performing the method for manufacturing the dopant layer according to claim 1; and
    forming an electrode electrically connected to the dopant layer.

18. The method according to claim 17, wherein the dopant layer is at least one of an emitter layer, a front surface field layer, and a back surface field layer.

* * * * *